(12) United States Patent
Paranthaman et al.

(10) Patent No.: US 7,683,010 B2
(45) Date of Patent: Mar. 23, 2010

(54) DOPED LZO BUFFER LAYERS FOR LAMINATED CONDUCTORS

(75) Inventors: Mariappan Parans Paranthaman, Knoxville, TN (US); Urs Schoop, Westborough, MA (US); Amit Goyal, Knoxville, TN (US); Cornelis Leo Hans Thieme, Westborough, MA (US); Darren T. Verebelyi, Oxford, MA (US); Martin W. Rupich, Framingham, MA (US)

(73) Assignee: UT-Battelle, LLC, Oak Ridge, TN (US)

( * ) Notice: Subject to any disclaimer, the term of this patent is extended or adjusted under 35 U.S.C. 154(b) by 1271 days.

(21) Appl. No.: 11/192,487

(22) Filed: Jul. 29, 2005

(65) Prior Publication Data

US 2007/0026247 A1 Feb. 1, 2007

(51) Int. Cl.
H01L 39/24 (2006.01)
(52) U.S. Cl. ...................... 505/237; 428/699
(58) Field of Classification Search ................ 505/237
See application file for complete search history.

(56) References Cited

U.S. PATENT DOCUMENTS

| | | |
|---|---|---|
| 5,595,960 A | 1/1997 | Belouet et al. |
| 6,077,344 A | 6/2000 | Shoup et al. |
| 6,150,034 A | 11/2000 | Paranthaman et al. |
| 6,156,376 A | 12/2000 | Paranthaman et al. |
| 6,159,610 A | 12/2000 | Paranthaman et al. |
| 6,235,402 B1 | 5/2001 | Shoup et al. |
| 6,270,908 B1 | 8/2001 | Williams et al. |
| 6,399,154 B1 | 6/2002 | Williams et al. |
| 6,428,920 B1 | 8/2002 | Badding et al. |
| 6,440,211 B1 | 8/2002 | Beach et al. |
| 6,537,689 B2 | 3/2003 | Schoop et al. |
| 6,596,421 B2 | 7/2003 | Schmidt et al. |
| 6,649,570 B2 | 11/2003 | Belouet |
| 6,663,976 B2 | 12/2003 | Beach et al. |
| 2004/0003768 A1* | 1/2004 | Goyal ............................ 117/2 |
| 2004/0157747 A1* | 8/2004 | Chen et al. ................... 505/238 |
| 2005/0217568 A1* | 10/2005 | Rupich et al. ................ 117/101 |

* cited by examiner

Primary Examiner—Stanley Silverman
Assistant Examiner—Paul Wartalowicz
(74) Attorney, Agent, or Firm—Joseph A. Marasco

(57) ABSTRACT

A laminated conductor includes a metallic substrate having a surface, a biaxially textured buffer layer supported by the surface of the substrate, the biaxially textured buffer layer comprising LZO and a dopant for mitigating metal diffusion through the LZO, and a biaxially textured conductor layer supported by the biaxially textured buffer layer.

12 Claims, 2 Drawing Sheets

DOPED LZO BUFFER LAYERS FOR LAMINATED CONDUCTORS

The United States Government has rights in this invention pursuant to contract no. DE-AC05-00OR22725 between the United States Department of Energy and UT-Battelle, LLC.

FIELD OF THE INVENTION

The present invention relates to layered conductors having biaxially textured buffer layers supporting a conducting layer such as a superconductor, a ferroelectric, piezoelectric or other semiconductor, and more particularly to such layered conductors having solution deposited layers, including doped lanthanum-zirconium-oxide (LZO) buffer layers.

BACKGROUND OF THE INVENTION

Buffer layers play a key role in high-temperature superconductor (HTS) materials, particularly in recently developed second-generation rare-earth-barium-copper-oxide (RE-BCO), especially yttrium-barium-copper-oxide (YBCO) wire technology. The purpose of the buffer layers is to provide a continuous, smooth and chemically inert surface for the growth of the YBCO film, while transferring the biaxial texture from the substrate to the YBCO. Buffer layers are important for preventing metal diffusion from the substrate into the superconductor, and as oxygen diffusion barriers. Multi-layer architectures have been developed that also provide mechanical stability and good adhesion to the substrate.

The following patents provide ample background teaching and are incorporated herein by reference:

U.S. Pat. No. 6,663,976 issued on Dec. 16, 2003 to D. B. Beach, J. S. Morrell, M. Paranthaman, T. Chirayil, E. D. Specht, and A. Goyal, "Laminate articles on biaxially textured metal substrates".

U.S. Pat. No. 6,399,154 issued on Jun. 4, 2002 to R. K. Williams, M. Paranthaman, T. G. Chirayil, D. F. Lee, A. Goyal, and R. Feenstra, entitled "Laminate Article".

U.S. Pat. No. 6,440,211 issued on Aug. 27, 2002 to D. B. Beach, J. S. Morrell, M. Paranthaman, T. G. Chirayil, E. D. Specht, and A. Goyal, entitled "Method of Depositing Buffer Layers on Biaxially Textured Metal Substrates".

U.S. Pat. No. 6,235,402 issued on May 22, 2001 to S. S. Shoup, M. Paranthaman, D. B. Beach, D. M. Kroeger, and A. Goyal, entitled "Buffer Layers on Biaxially Textured Metal Substrates".

U.S. Pat. No. 6,270,908 issued on Aug. 7, 2001 to R. K. Williams, M. Paranthaman, T. G. Chirayil, D. F. Lee, A. Goyal, and R. Feenstra, entitled "Rare Earth Zirconium Oxide Buffer Layers on Metal Substrate".

U.S. Pat. No. 6,077,344 issued on Jun. 20, 2000 to S. S. Shoup, M. Paranthaman, D. B. Beach, D. M. Kroeger, and A. Goyal, entitled "Sol-gel Deposition of Buffer Layers on Biaxially Textured Metal Substances".

U.S. Pat. No. 6,150,034 issued on Nov. 21, 2000 to M. Paranthaman, D. F. Lee, D. M. Kroeger, and A. Goyal, entitled "Buffer Layers on Rolled Nickel or Copper as Superconductor Substrates"

U.S. Pat. No. 6,156,376 issued on Dec. 5, 2000 to M. Paranthaman, D. F. Lee, D. M. Kroeger, and A. Goyal, entitled "Buffer Layers on Metal Surfaces Having Biaxial Texture as Superconductor Substrates".

U.S. Pat. No. 6,159,610 issued on Dec. 12, 2000 to M. Paranthaman, D. F. Lee, D. M. Kroeger, and A. Goyal, entitled "Buffer Layers on Metal Surfaces Having Biaxial Texture as Superconductor Substrates".

It is important that the highly aligned buffer materials are matched in both the lattice constant and thermal expansion to the biaxially textured substrate and the YBCO layer. The buffer layers should be smooth, continuous, crack-free and dense. Even though the buffer layers are much thinner than the YBCO layer, buffer deposition cost is a substantial part of the total conductor cost. Hence, there is a need for the development of economically feasible, efficient, scaleable, high rate, high quality buffer layers and associated deposition processes.

When growing an epitaxial oxide film on a metal surface it is essential to avoid oxide formation before the nucleation of the layer is complete. For example YBCO is typically grown in an atmosphere containing 100 ppm or more of oxygen at 700-800° C. Under such conditions Ni and W will form various native oxides on a NiW surface, i.e. at PO2 levels below the required PO2 levels to oxidize Ni or W. Most of such oxide layers do not offer the bi-axial cubic texture required for high critical currents in the HTS layer. However, the ability of certain oxide films to be grown in very low oxygen partial pressures, i.e. below the oxidation of Ni and even W can be utilized. A thin seed layer is deposited first, to subsequently allow the growth of the full buffer and finally the YBCO processing at higher oxygen levels.

Oxide diffusion in most films is rather fast compared to cation diffusion. In reality the oxidation of the metal substrate cannot be suppressed completely. Thin homogeneous oxide layers are observed after final processing of the conductor without negative impact on the performance. However the buffer stack controls the amount and the time when the oxide layer is formed at the interface between the buffer and the substrate. Uncontrolled growth of substrate oxides can result in multiple failures. Rapid and inhomogeneous oxide growth can penetrate the buffer layers and cause a break down of its barrier properties. For example, when excessive NiO is formed the full buffer stack delaminates from the metal template due to volume expansion of, for example, Ni to NiO.

Fundamental understanding of the oxygen diffusion through oxide buffers is under study. Even though it is possible to grow oxide buffers directly on textured metal surfaces under suitable reducing conditions, oxygen penetrates through the buffer layers such as yttrium oxide, cerium oxide, and lanthanum zirconium oxide (LZO) to the metal oxide interface during the YBCO processing. This is mainly because the oxygen diffusivity of these buffers at 800° C. is in the range of $10^{-9}$ to $10^{-10}$ cm$^2$/sec. The diffusion is more rapid in structures that are more prone to the occurrence of defects. Grain boundaries, pinholes and particulates can also provide short circuit diffusion paths in these films.

Referring to FIG. 1, some commonly used architectures begin with a starting template such as a rolling-assisted biaxially textured substrate (RABiTS) 1 comprising Ni—W (3 or 5 at. %). Layers include, for example, a layer 2 of LZO (200 nm) and a capping layer 3 of CeO$_2$ (75 nm), and a layer of YBCO 4. The buffers are generally deposited using MOD techniques. Electrical currents, Ic of about 140 A/cm over 10-meter long YBCO coated conductor tapes have been achieved. There is a need to reduce oxygen diffusion through the buffer layers to the substrate in order to improve the Ic. There is also a need to mitigate metal diffusion (Ni and W) from the substrate through the LZO layer.

OBJECTS OF THE INVENTION

Accordingly, objects of the present invention include provision of a YBCO conductor architecture that has a reduced oxygen diffusion through the buffer layers in order to improve the Ic of the conductor, and a reduced metal diffusion through the LZO layer to improve the Ic of the conductor. Further and other objects of the present invention will become apparent from the description contained herein.

SUMMARY OF THE INVENTION

In accordance with one aspect of the present invention, the foregoing and other objects are achieved by a laminated conductor includes a metallic substrate having a surface, a biaxially textured buffer layer supported by the substrate surface, the biaxially textured buffer layer comprising LZO and a dopant for mitigating metal diffusion through the LZO, a biaxially textured $CeO_2$ capping layer supported by and in contact with the biaxially textured, doped LZO buffer layer, and a biaxially textured conductor layer supported by the biaxially textured $CeO_2$ capping layer.

For a better understanding of the present invention, together with other and further objects, advantages and capabilities thereof, reference is made to the following disclosure and appended claims in connection with the above-described drawings.

DETAILED DESCRIPTION OF THE INVENTION

The present invention serves to improve the performance of chemical solution deposited (CSD) metal-organic-deposited (MOD) conductor architectures through reducing oxygen diffusion through the buffer layers. CSD deposition methods include but are not limited to metal-organic deposition (MOD), sol gel, and polymeric precursor routes. The present invention may also apply to various non-CSD buffer layer deposition methods.

Figure 2:
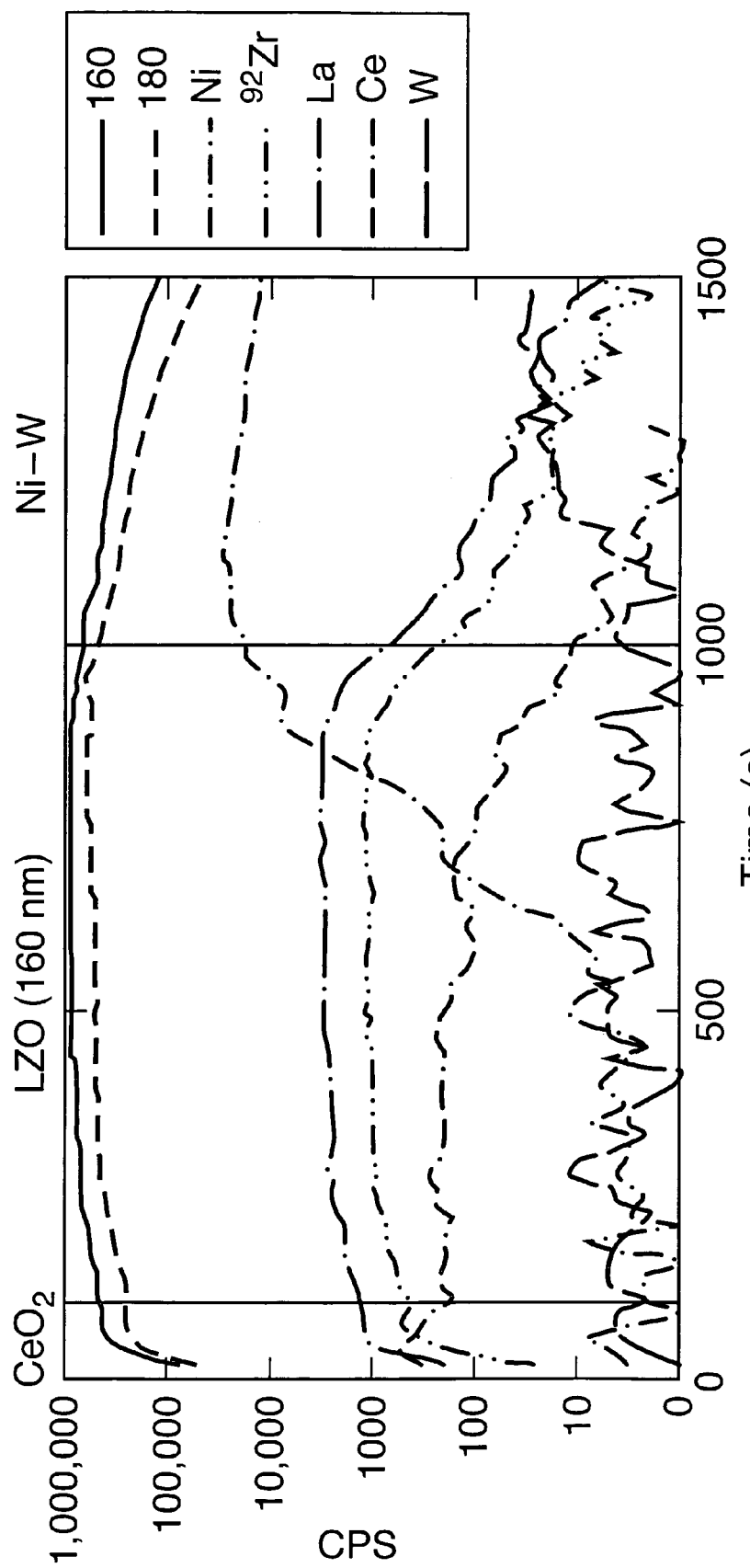
FIG. 2 is a graph showing SIMS analysis on $^{18}O$ annealed all MOD $CeO_2$/LZO/Ni—W substrate.

The data in FIG. 2 indicate that there is interdiffusion between $CeO_2$ and LZO layers. It is interesting to note that LZO suppresses the W diffusion from the substrate. However, the Ni signal in the LZO layer increases where the Ce signal begins to drop. Hence, it is possible to dope Ce into LZO to prevent Ni diffusion in LZO. It is also possible to dope La with other rare earth elements, alkaline earth elements or transition metal elements to reduce metal diffusion further.

In accordance with the present invention a dopant is introduced into MOD LZO to enhance the barrier properties thereof. The La site can be doped with Ce to mitigate metal diffusion from the substrate through the LZO layer. The Zr site may also be doped to improve the biaxial texture of the LZO layer. Both the La and Zr sites may be doped to achieve both benefits.

Figure 1:
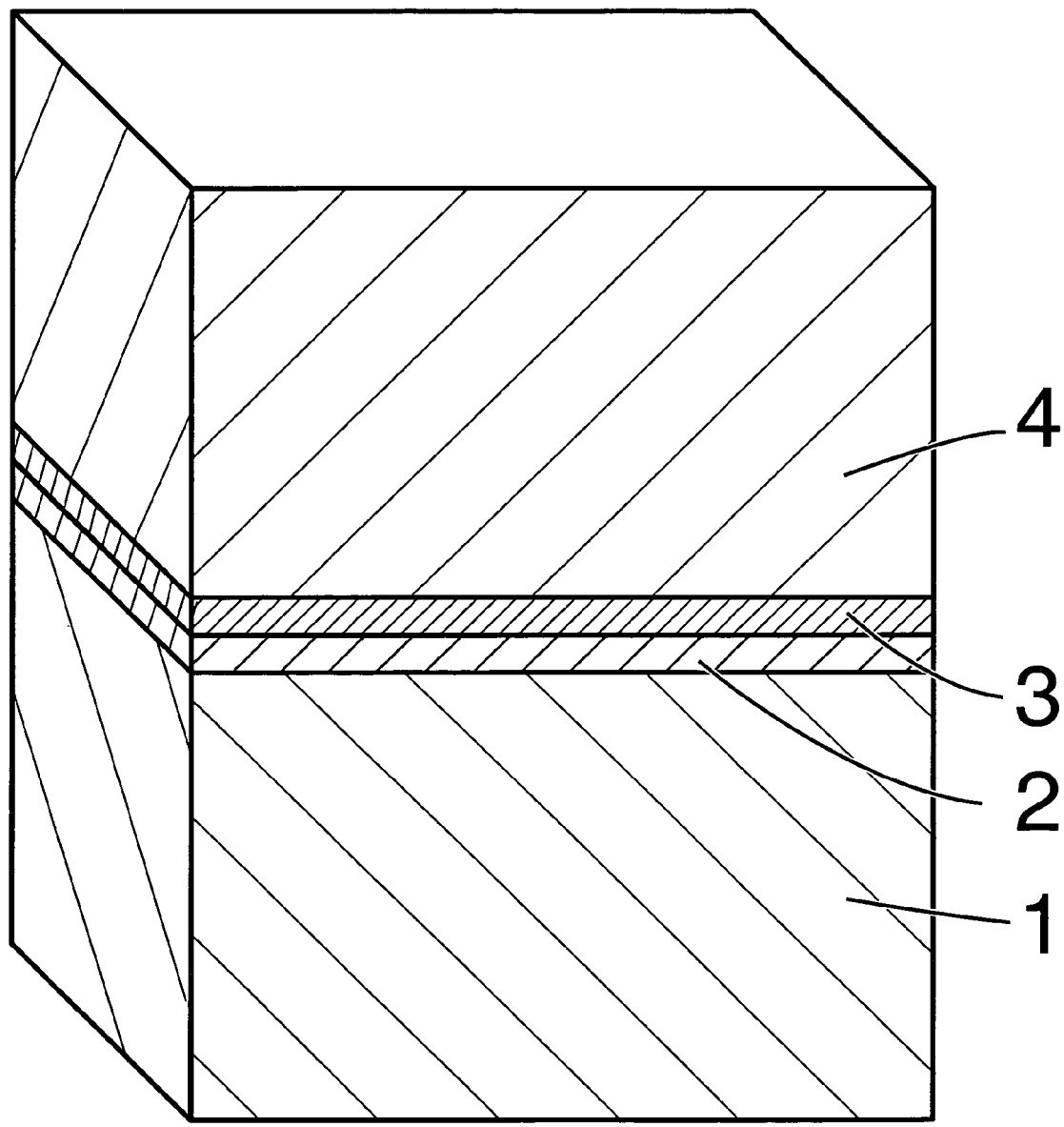
FIG. 1 is a schematic illustration of a typical YBCO coated conductor having four layers of various materials.

Referring again to FIG. 1, embodiments of the invention involve a substrate 1, an LZO buffer layer 2 (having a pyrochlore crystalline structure) that is doped in accordance with the present invention, a $CeO_2$ capping layer 3, and a REBCO superconductor layer 4, wherein RE is Y or another rare earth element alone or doped with another rare earth element. There may be other layers in between the described layers. Layer 4 could alternatively comprise a ferroelectric, piezoelectric or other semiconductor material.

Suitable La-site dopants in the pyrochlore crystalline structure include, but are not limited to Ce, Y, Pr, Nd, Pm, Sm, Eu, Gd, Tb, Dy, Ho, Er, Tm, Yb, Lu, and Ba. The concentration of dopant that is introduced into the LZO layer is operably in the range of at least 0.1 mole % and up to the saturation point (100 mole %), preferably in the range of at least 0.5 mole % and no more than 50 mole %, more preferably in the range of at least 1 mole % and no more than 30 mole %, most preferably in the range of at least 3 mole % and no more than 15 mole %.

Suitable Zr-site dopants in the pyrochlore crystalline structure include, but are not limited to Ca, Mg, Bi, Se, Co, Cr, Mn, Cu, Ce, Nb, Ta, Ti, Hf, Gd, V, Si. The concentration of dopant that is introduced into the LZO layer is operably in the range of at least 0.1 mole % and up to 30 mole %, preferably in the range of at least 0.5 mole % and no more than 15 mole %, more preferably in the range of at least 1 mole % and no more than 10 mole %, most preferably in the range of at least 3 mole % and no more than 7 mole %.

In determining the proper concentration of a particular dopant for improving the biaxial texture of the biaxially textured LZO layer, the skilled artisan will recognize that one must consider the role of the dopant—specifically enhancing the lattice alignment of the layer while minimizing defects therein. Minimal testing will show that too little dopant may result in insufficient enhancement of the lattice alignment of the LZO buffer layer, and that too much dopant may cause result in defects in the LZO buffer layer or other deleterious effects.

EXAMPLE

Ce (up to 100 mole %) doped $La_2Zr_2O_7$ layers were deposited on Ni—W alloy RABiTS substrates using metal organic deposition. Metal organic precursors of Ce doped $La_2Zr_2O_7$ were spin-coated onto Ni—W with a typical spin rate of 2000 rpm and 2 min. The precursor-coated substrates were then heat-treated in a flowing $Ar/H_2$ 4% mixture with controlled oxygen at 1100° C. for 15 min and quenched. X-ray diffraction showed the presence of highly textured LZO (Ce doped) layers.

While there has been shown and described what are at present considered the preferred embodiments of the invention, it will be obvious to those skilled in the art that various changes and modifications can be prepared therein without departing from the scope of the inventions defined by the appended claims.

What is claimed is:

1. A laminated conductor comprising:
   a. a metallic substrate having a surface;
   b. a biaxially textured buffer layer supported by said surface of said substrate, said biaxially textured buffer layer having a pyrochlore crystalline structure and comprising LZO, a first dopant, and a second dopant for mitigating metal diffusion through said LZO, said first dopant comprising at least one element selected from the group consisting of Ce, Pr, Nd, Pm, Sm, Eu, Gd, Tb, Dy, Ho, Er, Tm, Yb, Lu, Y, and Ba, and said second dopant comprising at least one element selected from the group consisting of Ca, Mg, Bi, Se, Co, Cr, Mn, Cu, Nb, Ta, Ti, Hf, V, and Si;
   c. a biaxially textured $CeO_2$ capping layer supported by and in contact with said biaxially textured, doped LZO buffer layer; and
   d. a biaxially textured conductor layer supported by and in contact with said biaxially textured $CeO_2$ capping layer.

2. A laminated conductor in accordance with claim 1 wherein said surface of said metallic substrate is biaxially textured.

3. A laminated conductor in accordance with claim 2 wherein said biaxially textured buffer layer is in contact with said biaxially textured surface of said substrate.

4. A laminated conductor in accordance with claim 1 wherein said first dopant is present in a concentration in the range of about 0.1 to about 100 mole %.

5. A laminated conductor in accordance with claim 4 wherein said first dopant is present in a concentration in the range of about 0.05 to about 50 mole %.

6. A laminated conductor in accordance with claim 5 wherein said first dopant is present in a concentration in the range of about 1 to about 30 mole %.

7. A laminated conductor in accordance with claim 6 wherein said first dopant is present in a concentration in the range of about 3 to about 15 mole %.

8. A laminated conductor in accordance with claim 1 wherein said second dopant is present in a concentration in the range of about 0.1 to about 30 mole %.

9. A laminated conductor in accordance with claim 8 wherein said second dopant is present in a concentration in the range of about 0.05 to about 15 mole %.

10. A laminated conductor in accordance with claim 9 wherein said second dopant is present in a concentration in the range of about 1 to about 10 mole %.

11. A laminated conductor in accordance with claim 10 wherein said second dopant is present in a concentration in the range of about 3 to about 7 mole %.

12. A laminated conductor in accordance with claim 1 wherein said conductor layer comprises a REBCO high temperature superconductor.

* * * * *